United States Patent
Ogino et al.

(10) Patent No.: US 11,208,726 B2
(45) Date of Patent: Dec. 28, 2021

(54) MICROETCHING AGENT FOR COPPER, COPPER SURFACE ROUGHENING METHOD AND WIRING BOARD PRODUCTION METHOD

(71) Applicant: MEC COMPANY LTD., Hyogo (JP)

(72) Inventors: Yuki Ogino, Hyogo (JP); Takahiro Sakamoto, Hyogo (JP); Kaoru Urushibata, Hyogo (JP)

(73) Assignee: MEC COMPANY LTD., Hyogo (JP)

( * ) Notice: Subject to any disclaimer, the term of this patent is extended or adjusted under 35 U.S.C. 154(b) by 0 days.

(21) Appl. No.: 16/646,604

(22) PCT Filed: Aug. 20, 2018

(86) PCT No.: PCT/JP2018/030714
§ 371 (c)(1),
(2) Date: Mar. 12, 2020

(87) PCT Pub. No.: WO2019/058835
PCT Pub. Date: Mar. 28, 2019

(65) Prior Publication Data
US 2020/0263308 A1 Aug. 20, 2020

(30) Foreign Application Priority Data
Sep. 22, 2017 (JP) .............................. JP2017-183064

(51) Int. Cl.
C23F 1/18 (2006.01)
C23C 22/52 (2006.01)
H05K 3/38 (2006.01)

(52) U.S. Cl.
CPC ............... *C23F 1/18* (2013.01); *C23C 22/52* (2013.01); *H05K 3/383* (2013.01); *H05K 2203/0789* (2013.01)

(58) Field of Classification Search
None
See application file for complete search history.

(56) References Cited

U.S. PATENT DOCUMENTS

| 5,532,094 A | 7/1996 | Arimura et al. |
| 5,807,493 A | 9/1998 | Maki et al. |

(Continued)

FOREIGN PATENT DOCUMENTS

| CN | 1147025 | 4/1997 |
| EP | 2 241 653 | 10/2010 |

(Continued)

OTHER PUBLICATIONS https://web.archive.org/web/20120419165349/http://www.trimen.pl/witek/calculators/stezenia.html (Year: 2012).*

(Continued)

*Primary Examiner* — Shamim Ahmed
(74) *Attorney, Agent, or Firm* — Wenderoth, Lind & Ponack, L.L.P.

(57) ABSTRACT

A microetching agent is an acidic aqueous solution containing an organic acid, cupric ions, and halide ions. The molar concentration of halide ion of the microetching agent is 0.005 to 0.1 mol/L. By bringing the microetching agent into contact with a copper surface, the copper surface is roughened. An average etching amount in the depth direction during roughening is preferably 0.4 μm or less. The microetching agent can impart on copper surfaces a roughened shape having excellent adhesiveness to resins and the like, even with a low etching amount.

2 Claims, 1 Drawing Sheet

(56) References Cited

U.S. PATENT DOCUMENTS

| | | | | |
|---|---|---|---|---|
| 5,965,036 | A * | 10/1999 | Maki | C23F 1/18 216/105 |
| 6,426,020 | B1 | 7/2002 | Okada et al. | |
| 2005/0109734 | A1* | 5/2005 | Kuriyama | H05K 3/26 216/108 |
| 2005/0236359 | A1* | 10/2005 | Hu | C23F 1/44 216/34 |
| 2007/0051693 | A1* | 3/2007 | Feng | H05K 3/383 216/13 |
| 2007/0138142 | A1* | 6/2007 | Feng | C23F 1/16 216/100 |
| 2008/0041824 | A1* | 2/2008 | Feng | C23F 1/18 216/108 |
| 2008/0264900 | A1 | 10/2008 | Feng et al. | |
| 2014/0030425 | A1* | 1/2014 | Owei | H05K 3/383 427/97.1 |
| 2014/0326696 | A1 | 11/2014 | Kurii et al. | |
| 2015/0115196 | A1 | 4/2015 | Kurii et al. | |
| 2015/0307779 | A1 | 10/2015 | Choung et al. | |

FOREIGN PATENT DOCUMENTS

| | | |
|---|---|---|
| JP | 7-292483 | 11/1995 |
| JP | 2001-2003 80 | 7/2001 |
| JP | 2006-111953 | 4/2006 |
| JP | 2013-211346 | 10/2013 |
| JP | 2014-25088 | 2/2014 |
| KR | 10-2014-0027942 | 3/2014 |
| TW | 201419972 | 5/2014 |
| WO | 2013/187537 | 12/2013 |
| WO | 2014/017115 | 1/2014 |

OTHER PUBLICATIONS

International Search Report (ISR) dated Oct. 16, 2018 in International (PCT) Application No. PCT/JP2018/030714.
Written Opinion dated Oct. 16, 2018 in International (PCT) Application No. PCT/JP2018/030714, together with English translation thereof.
Extended European Search Report dated Oct. 5, 2020 in corresponding European Patent Application No. 18859430.3.

* cited by examiner

MICROETCHING AGENT FOR COPPER, COPPER SURFACE ROUGHENING METHOD AND WIRING BOARD PRODUCTION METHOD

TECHNICAL FIELD

The invention relates to a microetching agent for copper, method for roughening copper surface, and method for producing a wiring board.

BACKGROUND ART

In production of a printed wiring board, a copper surface is roughened with a microetching agent (roughening agent) for improving adhesion between the copper surface and a resin material such as a solder resist. As microetching agents for copper or copper alloys, organic acid-based microetching agents and inorganic acid-based microetching agents are known. These microetching agents contain an acid and an oxidizing agent, and further contain halogen, a polymer, a surfactant or the like for the purpose of adjusting the roughened shape and the etching rate.

In general, in roughening with a microetching agent, a larger etching amount tends to progress roughening to form deeper irregularities, resulting in improvement of adhesion with a resin etc. On the other hand, when copper wiring is roughened with a microetching agent, the wire may be thinned with progress of etching, leading to occurrence of defects such as increase in resistance and wire breakage. Since wiring is significantly thinned with pitch narrowing of wiring (fine wiring), a microetching agent capable of attaining high adhesion with a low etching amount has been needed.

An organic acid-based etching agent is capable of performing roughening with a lower etching amount as compared with an inorganic acid-based etching agent. For example, Patent Document 1 discloses an organic acid-based etching agent in which the concentration ratio of a polymer and an amino group-containing compound is within a predetermined range, the etching agent being capable of forming a roughened shape excellent in adhesion with a resin at an etching depth of about 0.7 µm.

PRIOR ART DOCUMENTS

Patent Documents

Patent Document 1: WO 2014/017115

SUMMARY OF THE INVENTION

Problems to be Solved by the Invention

In recent years, pitch narrowing of wiring (fine wiring) has been rapidly progressing. Accordingly, a microetching agent capable of forming a roughened shape excellent in adhesion with a resin with a smaller etching amount has been needed.

Means for Solving the Problems

The present invention is based on the finding that when a copper surface is treated with an organic acid-based aqueous solution having a low halide ion concentration, a roughened shape specifically excellent in adhesion with a resin etc. is formed with a low etching amount. The "copper" herein includes copper and copper alloys. The "copper layer" includes copper wiring pattern layers.

The microetching agent of the present invention is an acidic aqueous solution containing an organic acid, cupric ions and halide ions. The halide ion concentration of the microetching agent is 0.005 to 0.10 mol/L. The molar concentration of cupric ions is preferably at least 2.2 times the molar concentration of halide ions. The cupric ion concentration is preferably 0.05 to 2 mol/L.

In one embodiment, the microetching agent is substantially free from a polymer. Since the microetching agent does not contain a polymer as an essential component, concentration control of each component in the microetching agent is easy, and effluent disposal is simplified.

Further, the present invention relates to a method for roughening a copper surface using the microetching agent, and a method for producing a wiring board. By bringing a microetching agent into contact with a copper surface, the copper surface is roughened. The etching amount in roughening treatment is preferably 0.4 µm or less. The "etching amount" refers to an average etching amount (amount of dissolution) in a depth direction, and is calculated from the weight and specific gravity of copper dissolved by the microetching agent and the front projected area of a copper surface. The same applies to the "etching amount" below. In production of the wiring board, a step of adhering a resin to a roughened copper surface is carried out.

Effects of the Invention

According to the present invention, a roughened shape excellent in adhesion with a resin etc. can be formed on a copper surface with a low etching amount.

MODE FOR CARRYING OUT THE INVENTION

[Composition of Microetching Agent]

Figure 1:
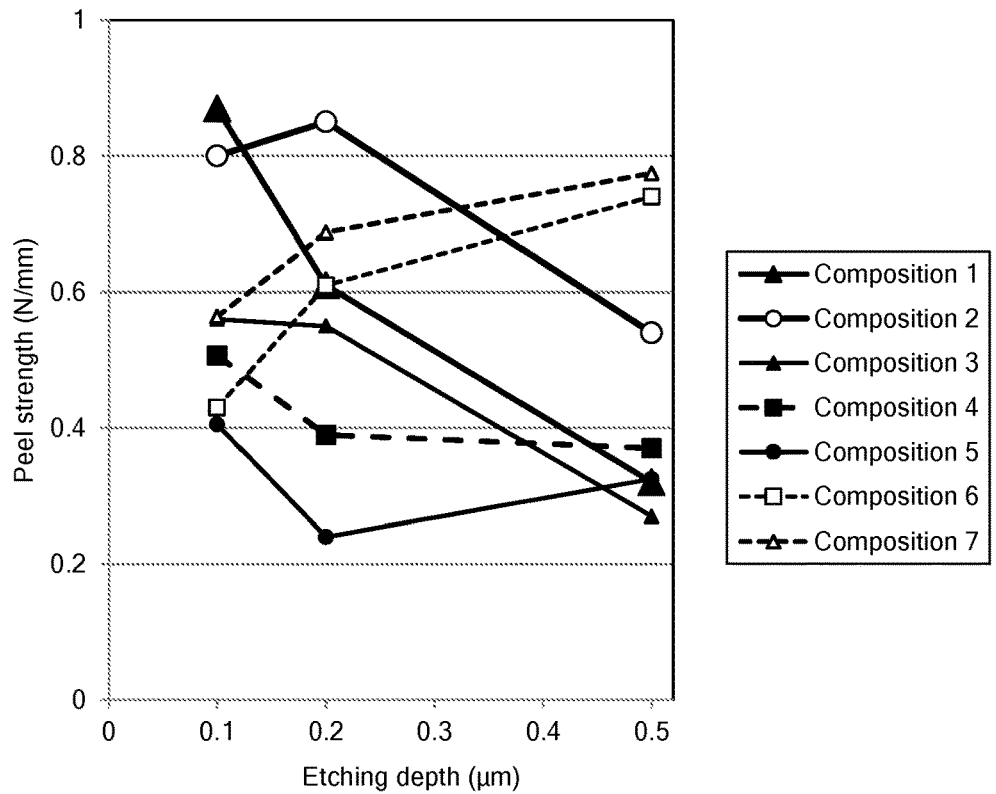
FIG. 1 shows graphs obtained by plotting a relationship between an etching amount and a peel strength for composites in which a resin layer is formed on a copper surface treated with microetching agents of Compositions 1 to 7.

The microetching agent of the present invention is used for roughening surface of copper. The microetching agent is an acidic aqueous solution containing an organic acid, a cupric ion, and a halide ion. Components contained in the microetching agent of the present invention will be described below.

<Cupric Ion>

The cupric ion acts as an oxidant for oxidizing copper. Examples of the cupric ion source include copper halides such as cupric chloride and cupric bromide; inorganic acid salts such as cupric sulfate and cupric nitrate; organic acid salts such as cupric formate and cupric acetate; cupric hydroxide; and cupric oxide.

When a cupric halide is used as a cupric ion source, the halide ion concentration of the etching agent may increase to the extent that it is impossible to form an appropriate roughened shape on the copper surface with a low etching amount. In addition, when the halide ion concentration is high, the etching rate may increase to the extent that it is difficult to control the etching amount. Thus, it is preferable that a halogen-free copper salt of an inorganic acid or an organic acid, or the like is used as a cupric ion source. When a cupric ion source containing a halogen, it is preferable to use a halogen-free cupric ion source in combination.

The cupric ion concentration of the microetching agent is preferably 0.05 to 2 mol/L, more preferably 0.1 to 1 mol/L, further preferably 0.2 to 0.5 mol/L. By adjusting the cupric ion concentration, production of cuprous ions by oxidation of copper can be appropriately controlled.

<Organic Acid>

The organic acid has a function of dissolving copper oxidized by a cupric ion, as well as a function of adjusting pH. It is preferred to use an organic acid having a pKa of 5 or less from the viewpoint of solubility of oxidized copper. Examples of the organic acid having a pKa of 5 or less include: saturated fatty acids such as formic acid, acetic acid, propionic acid, butyric acid, valeric acid and caproic acid; unsaturated fatty acids such as acrylic acid, crotonic acid and isocrotonic acid; aliphatic saturated dicarboxylic acids such as oxalic acid, malonic acid, succinic acid, glutaric acid, adipic acid and pimelic acid; aliphatic unsaturated dicarboxylic acids such as maleic acid; aromatic carboxylic acids such as benzoic acid, phthalic acid and cinnamic acid; carboxylic acids having a substituent, such as oxycarboxylic acids such as glycolic acid, lactic acid, malic acid, and citric acid, sulfamic acid, β-chloropropionic acid, nicotinic acid, ascorbic acid, hydroxypivalic acid and levulinic acid; and derivatives thereof. The aforementioned organic acids may be used in combination of two or more thereof.

The concentration of the organic acid in the microetching agent is preferably 0.1 to 20% by weight, more preferably 0.5 to 15% by weight, further preferably 1 to 10% by weight, from the viewpoint of the solubility of oxidized copper. The microetching agent is an acidic aqueous solution, and therefore has a pH of less than 7. The microetching agent is an organic acid-based aqueous solution, and therefore has a pH of more than 1. From the viewpoint of adjusting the etching rate to an appropriate range, the pH of the microetching solution is preferably 1.3 to 5, more preferably 1.5 to 4.5, further preferably 1.7 to 4.

<Halide Ion>

The halide ion has a function of aiding dissolution of copper to form a copper layer surface excellent in adhesion. Examples of the halide ion source may be ion sources of a chloride ion, a bromide ion and the like. Chloride ion is particularly preferred for uniformly forming a copper layer surface excellent in adhesion. Two or more kind of halide ion may be contained.

Examples of the halide ion source include hydrohalic acids such as hydrochloric acid and hydrobromic acid; and metal salts such as sodium chloride, calcium chloride, potassium chloride, ammonium chloride, potassium bromide, sodium bromide, copper chloride, copper bromide, zinc chloride, iron chloride and tin bromide. The halide ion sources may be used in combination of two or more thereof.

From the viewpoint of promoting formation of a roughened shape onto the surface of the copper layer, the concentration of the halide ion in the microetching agent is preferably 0.005 to 0.1 mol/L. When the halide ion concentration is 0.1 mol/L or more, solubility of oxidized copper (cuprous ion) can be controlled so that a roughened shape excellent in adhesion with a resin is formed with an etching amount of less than 0.5 μm. When the halide ion concentration is 0.005 mol/L or more, etching rate can be adjusted to an appropriate range. For enhancing the etching rate, the halide ion concentration is more preferably 0.01 mol/L or more, further preferably 0.02 mol/L or more.

For forming a roughened shape excellent in adhesion to a resin with an etching amount of about 0.1 μm, the halide ion concentration is particularly preferably about 0.02 to 0.08 mol/L. For forming a roughened shape excellent in adhesion to a resin with an etching amount of about 0.2 μm, the halide ion concentration is particularly preferably about 0.04 to 0.1 mol/L.

In the etching agent containing cupric ions as an oxidizing agent, metallic copper is oxidized and cupric ions are reduced to form cuprous ions. A cuprous halide such as cuprous chloride has a low solubility, and therefore in etching with a solution containing halide ions and cupric ions, a cuprous halide produced by oxidation of copper is deposited as an undesired product on a copper surface. On the other hand, one cuprous ion forms a soluble complex with four halide ions. Thus, the cuprous halide deposited on the copper surface is dissolved, so that etching progresses.

One feature of the microetching agent of the present invention is that the halide ion concentration is lower than that of a conventional organic acid-based microetching agent. Since the halide ion concentration is low, a cuprous halide produced by oxidation of copper is difficult to dissolve, and thus tends to easily form a film on the surface of copper as an insoluble substance. Irregularities are formed on the surface at the time of dissolving copper and at the time of dissolving the film deposited on the copper surface. There is an appropriate balance between the production of cuprous ions and dissolution of cuprous ions at a low etching amount, and this may be a factor of forming a surface shape excellent in adhesion with a resin.

From the viewpoint of appropriately balancing the rate at which cuprous ions are produced by oxidation of copper and the rate at which cuprous ions are dissolved by formation of a complex of cuprous ions and a halogen, it is preferable that the microetching agent has a small halide ion concentration, and contains an excessive amount of cupric ions with respect to halide ions. The molar concentration of cupric ions in the microetching agent is preferably at least 2.2 times the molar concentration of halide ions. The cupric ion concentration is preferably not more than 30 times the halide ion concentration.

For forming a roughened shape excellent in adhesion to a resin with an etching amount of about 0.1 μm, the molar concentration of cupric ions is preferably 3 to 25 times, particularly preferably 5 to 15 times the molar concentration of halide ions. For forming a roughened shape excellent in adhesion to a resin with an etching amount of about 0.2 μm, the molar concentration of cupric ions is preferably 2.2 to 15 times, particularly preferably 2.3 to 10 times the molar concentration of halide ions.

<Other Additives>

The microetching agent of the present invention can be easily prepared by dissolving the aforementioned components in ion-exchanged water or the like. The microetching agent may contain components other than those described above. For example, a salt such as a sodium salt or potassium salt of an organic acid may be added for reducing variations of pH during roughening treatment. A nonionic surfactant may be added for improving in-plane uniformity of roughened shape, or the like. Nonionic surfactant may also function as an antifoaming agent. A complexing agent such as amine may be added for improving dissolving stability of copper. In addition, various additives may be added as required. When these additives are added, the concentration of the additives in the microetching agent is about 0.0001 to 20% by weight.

A polymer may be added to the microetching agent of the present invention for the purpose of promoting roughening or adjusting the roughened shape as in the case of conventional organic acid-based microetching agents. Examples of the polymer suitable for promoting roughening include cationic polymers having a weight average molecular weight of 1000 or more, such as polyethyleneimine and quaternary ammonium group-containing polymers. Even when the microetching agent of the present invention does not contain a polymer, a roughened shape excellent in adhesion with a resin can be formed with a low etching amount. Thus, the microetching agent may be free from a polymer. From the viewpoint of facilitating effluent disposal, the microetching agent of the present invention is preferably substantially free from a polymer, and in particular, substantially free from a cationic polymer which can affect the roughened shape in an organic acid-based microetching agent.

The term "substantially free" from a polymer means that a polymer is not intentionally added, and polymers inevitably mixed as an impurities may be present. In the microetching agent, the concentration of polymers having a weight average molecular weight of 1000 or more is more preferably 5 ppm or less, further preferably 1 ppm or less, even more preferably 0.5 ppm or less, particularly preferably 0.1 ppm or less. In particular, the content of cationic polymers having a weight average molecular weight of 1000 or more is preferably within the above-described range.

[Usage of Microetching Agent]

The aforementioned microetching can be widely used for roughening a copper layer surface, and so on. In particular, when the copper surface is treated with a low etching amount of less than 0.5 µm, a characteristic roughened shape is formed, so that adhesion with the resin of a prepreg, a plating resist, an etching resist, a solder resist, an electrodeposition resist, a coverlay or the like is improved. The roughened copper surface is excellent in solderability, and is therefore particularly useful for production of various wiring boards including those for pin grid array (PGA) and those for ball grid array (BGA). It is also useful for surface treatment of a lead frame.

In particular, since the microetching agent of the present invention is capable of forming a surface excellent in adhesion with a low etching amount, the microetching agent is useful for treatment for improvement of adhesion of a rewiring copper layer of a printed wiring board, a fan out wafer level package (FOWLP) or a LSI requiring fine copper wiring, etc., and contributes to suppression of resistance increase and breakage of copper wiring.

[Copper Surface Roughening Method]

The aforementioned microetching agent is brought into contact with the surface of a copper layer to roughen the surface thereof. In the roughening treatment, the method for bringing the microetching agent into contact with the surface of the copper layer is not particularly limited, and examples thereof include a method in which a microetching agent is sprayed to the surface of a copper layer to be treated and a method in which a copper layer to be treated is dipped in a microetching agent. When the microetching agent is sprayed, it is preferred to perform etching at a microetching agent temperature of 10 to 40° C. and a spray pressure of 0.03 to 0.3 MPa for 5 to 120 seconds. When the copper layer is dipped, it is preferred to perform etching at a microetching agent temperature of 10 to 40° C. for 5 to 120 seconds. Furthermore, when the copper layer is dipped in a microetching agent, it is preferred to blow air into the microetching agent by bubbling or the like so that a cuprous ion generated in the microetching agent by etching of copper is oxidized to a cupric ion.

When the etching amount is excessively small, it may be impossible to form a sufficient roughened shape, and therefore, the etching amount is preferably 0.01 µm or more, more preferably 0.02 µm or more, further preferably 0.04 µm or more.

When a conventional microetching agent is used, a larger etching amount tends to lead to formation of deeper irregularities on the copper surface, resulting in improvement of adhesion with a resin. On the other hand, in treatment of the copper surface with the microetching agent of the present invention, a roughened shape specifically excellent in adhesion with a resin is formed when the etching amount is less than 0.5 µm. In particular, from the viewpoint of improving adhesion with a resin and suppressing breakage and increase in resistance of wiring, the etching amount is preferably 0.4 µm or less, more preferably 0.35 µm or less, further preferably 0.3 µm or less, particularly preferably 0.25 µm or less.

When the microetching agent is continuously used, it is preferable to perform the roughening treatment while adding a replenishing liquid. The concentrations of the components in the microetching agent during the treatment can be properly maintained by performing the roughening treatment while adding the replenishing liquid into the microetching agent. The replenishing liquid is preferably an aqueous solution containing components (e.g., acids and halide ions) which decrease in amount as etching progresses. The replenishing liquid may contain a cupric ion source. The adding amount of the replenishing liquid and the timing of adding the replenishing liquid can be appropriately set according to the concentration control range of each component or the like. The components in the replenishing liquid are similar to the components contained in the microetching agent described above. The concentrations of the components in the replenishing liquid are appropriately adjusted according to the initial concentration of the microetching agent to be used for treatment, or the like. The composition of the replenishing liquid may be identical to that of the initial makeup solution (microetching agent before use). When the microetching agent is substantially free from a polymer, it is preferable that the replenishing liquid is also substantially free from a polymer.

After the roughening treatment, the roughened surface may be washed with an acidic aqueous solution. As the acidic aqueous solution to be used for washing, hydrochloric acid, an aqueous sulfuric solution, a nitric acid aqueous solution and the like can be used. Hydrochloric acid is preferred because it has less influence on a roughened shape and has excellent washing ability. The acid concentration of the acidic aqueous solution is preferably 0.3 to 35% by weight, more preferably 1 to 10% by weight. The washing method is not particularly limited, and examples thereof include a method in which an acidic aqueous solution is sprayed to a roughened copper layer surface and a method in which a roughened copper layer is dipped in an acidic aqueous solution.

After the treatment with the microetching agent, a treatment with an aqueous solution of azoles or an alcohol solution may be performed in order to further improve adhesion to a resin. Further, after the treatment with the microetching agent of the present invention, an oxidation treatment called a brown oxide treatment or a black oxide treatment may be performed.

[Method for Producing Wiring Board]

In production of a wiring board, the resin (resin composition) of a prepreg, a plating resist, an etching resist, a solder resist, an electrodeposition resist, a coverlay or the like is adhered to the surface of a copper layer before patterning by etching and the surface of the copper layer (copper wiring) after patterning. The method for adhering the resin is not particularly limited, and application of a resin solution, or a resin molding method such as injection molding, extrusion molding, hot press molding, laser welding molding or spray molding can be employed. In producing a wiring board having a plurality of copper layers, one layer among the plurality of copper layers may be treated with the aforementioned microetching agent, or alternatively, two or more of the copper layers may be treated with the aforementioned microetching agent.

EXAMPLE

Examples of the present invention are described along with Comparative Examples. The present invention should not be construed to be limited to Examples below.

[Preparation of Microetching Agent]

Aqueous solution (microetching agent) of Compositions shown in Table 1 were prepared. "UNISENCE FPV1000L" in Composition 6 is a 20 wt % aqueous solution of quaternized polydimethylaminoethyl methacrylate having a weight average molecular weight of 100,000 to 500,000 (manufactured by SENKA Corporation). The balance in each Composition shown in Table 1 is ion-exchanged water.

[Evaluation of Adhesion to Solder Resist]

Each of microetching agents (25° C.) of Compositions 1 to 7 shown in Table 1 was sprayed at a spraying pressure of 0.05 MPa to a plated surface of a test piece having a 20 μm electroplated copper formed on a 35 μm-thick electrolytic copper foil, and etching was performed with the etching time adjusted so that the etching amount was 0.1 μm. Next, the test piece was rinsed with water, and the etched surface was sprayed with 3.5% hydrochloric acid at a temperature of 25° C. for 10 seconds, followed by performing rinsing with water and drying. A photosensitive liquid solder resist ("SR-7300G" manufactured by Hitachi Chemical Company) was applied in a thickness of 20 μm to the etched surface of each copper foil after drying, and cured to form a composite. A 1.6 mm-thick copper clad laminate plate as a backing plate was bonded to the surface of the solder resist layer of the composite with an adhesive ("Bond E Set" manufactured by Konishi Co., Ltd.), followed by cutting only the copper foil portion into a line shape having a width of 1 cm. Thereafter, the peel strength between the copper foil cut into a line shape and the solder resist layer was measured in accordance with JIS C 6481. The results are shown in Table 1.

[Evaluation of Correlation Between Etching Amount and Peel Strength]

Using each of microetching agents of Compositions 1 to 7, etching was performed with the etching time changed so that the etching amount was 0.2 μm or 0.5 μm, and in the same manner as described above, rinsing and formation of a solder resist layer were performed, and the peel strength of the composite was measured. FIG. 1 shows graphs obtained by plotting a relationship between the etching amount and the peel strength for samples in which a copper surface is roughened with the etching agents of Compositions 1 to 7.

[Moisture Absorption Degradation Test]

Figure 2:
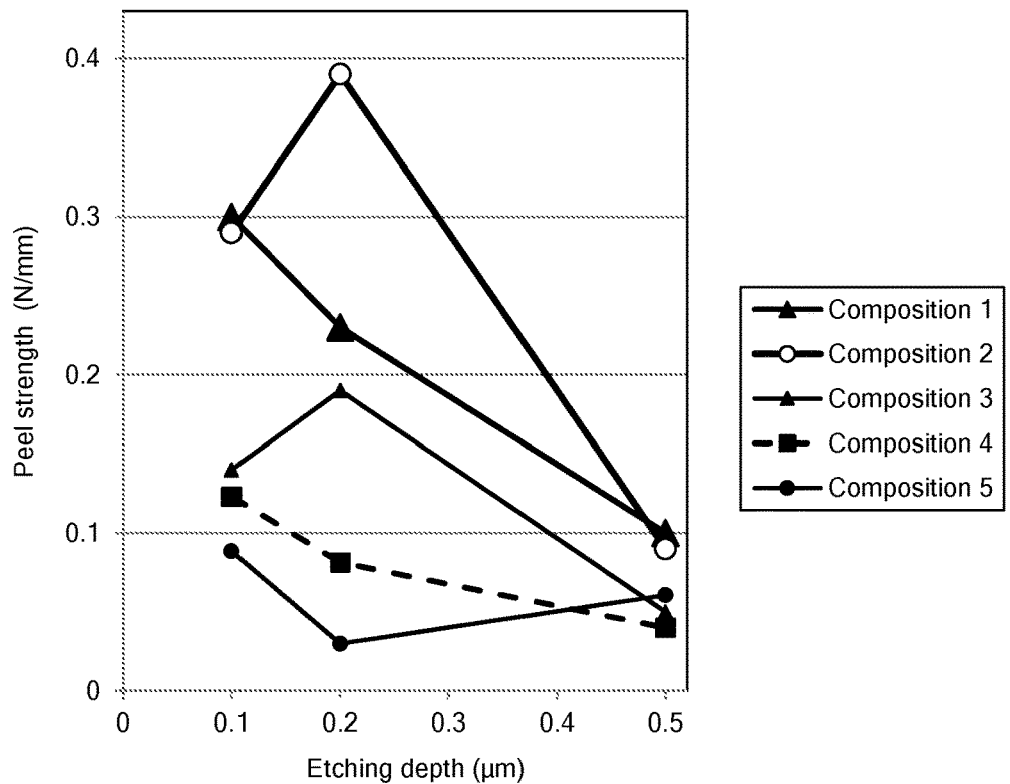
FIG. 2 shows graphs obtained by plotting a relationship between an etching amount and a peel strength for moisture absorption degraded samples of composites in which a resin layer is formed on a copper surface treated with microetching agents of Compositions 1 to 5.

Using each of microetching agents of Compositions 1 to 5, etching was performed with the etching time changed so that the depth was 0.1 μm, 0.2 μm or 0.5 μm, and in the same manner as described above, rinsing and formation of a solder resist layer were performed to form a composite. The composite was placed in a high accelerated stress test (HAST) apparatus at 130° C. and a humidity of 85% for 50 hours to undergo moisture absorption degradation. Using the composite after moisture absorption degradation as a sample, the peel strength was measured in the same manner as described above. FIG. 2 shows graphs obtained by plotting the relationship between the etching depth and the peel strength of the sample after moisture absorption degradation.

TABLE 1

| composition | ingredient | amount (g/L) | pH | $[Cl^-]$ (mmol/L) | $[Cu^{2+}]$ (mmol/L) | $[Cu^{2+}]/[Cl^-]$ | peel strength (N/mm) |
|---|---|---|---|---|---|---|---|
| 1 | sodium chloride | 3.0 | 3.1 | 51 | 409 | 7.96 | 0.87 |
|   | copper(II) oxide | 32.5 | | | | | |
|   | 76% formic acid | 70.2 | | | | | |
|   | sodium formate | 40.0 | | | | | |
| 2 | sodium chloride | 4.5 | 2.1 | 77 | 283 | 3.67 | 0.80 |
|   | copper(II) oxide | 22.5 | | | | | |
|   | 76% formic acid | 82.0 | | | | | |
|   | sodium formate | 9.0 | | | | | |
| 3 | sodium chloride | 9.0 | 3.1 | 154 | 409 | 2.65 | 0.56 |
|   | copper(II) oxide | 32.5 | | | | | |
|   | 76% formic acid | 70.2 | | | | | |
|   | sodium formate | 40.0 | | | | | |
| 4 | sodium chloride | 12.0 | 3.1 | 205 | 409 | 1.99 | 0.51 |
|   | copper(II) oxide | 32.5 | | | | | |
|   | 76% formic acid | 70.2 | | | | | |
|   | sodium formate | 40.0 | | | | | |
| 5 | sodium chloride | 24.0 | 3.1 | 411 | 409 | 0.99 | 0.41 |
|   | copper(II) oxide | 32.5 | | | | | |
|   | 76% formic acid | 70.2 | | | | | |
|   | sodium formate | 40.0 | | | | | |
| 6 | sodium chloride | 40.0 | 3.4 | 1130 | 223 | 5.07 | 0.43 |
|   | copper(II) chloride dihydrate | 38.0 | | | | | |
|   | 76% formic acid | 55.0 | | | | | |
|   | sodium formate | 30.0 | | | | | |
|   | ammonium acetate | 65.0 | | | | | |

TABLE 1-continued

| composition | ingredient | amount (g/L) | pH | [Cl⁻] (mmol/L) | [Cu²⁺] (mmol/L) | [Cu²⁺]/[Cl⁻] | peel strength (N/mm) |
|---|---|---|---|---|---|---|---|
| 7 | UNISENCE FPV1000L | 0.014 | <1 | 0.51 | 483 | 0.0011 | 0.56 |
|  | sodium chloride | 0.03 | | | | | |
|  | copper(II) sulfate pentahydrate | 120.5 | | | | | |
|  | 62.5% sulfonic acid | 180.0 | | | | | |
|  | 30% hydrogen peroxide | 8.5 | | | | | |
|  | 5-phenyltetrazole | 0.5 | | | | | |

As shown in Table 1, a peel strength of 0.8 N/mm or more was exhibited with an etching amount of 0.1 μm when the copper surface was roughened with the microetching agents of Compositions 1 and 2. When any of the microetching agents of Compositions 3 to 7 was used, the peel strength was lower as compared to Compositions 1 and 2.

As shown in FIG. 1, the peel strength tended to increase as the etching amount became larger for the microetching agents of Composition 6 and Composition 7. For these microetching agents, a peel strength of about 0.8 N/mm was exhibited with an etching amount of 0.5 μm, and with each of etching amounts of 0.1 μm and 0.2 μm, the peel strength was lower as compared to Compositions 1 and 2.

For the microetching agent of Composition 1, the highest peel strength was exhibited with an etching amount of 0.1 μm, and the peel strength decreased as the etching amount increased. For the microetching agent of Composition 2, the peel strength reached the maximum with an etching amount of 0.2 μm, and the peel strength decreased with an etching amount of 0.5 μm. For Compositions 3 to 5 with a higher halide ion concentration as compared to Compositions 1 and 2, the peel strength was lower as compared to Compositions 1 and 2 with each of etching amounts of 0.1 μm and 0.2 μm.

These results show that the microetching agents of Compositions 1 and 2 with a low halide ion content exhibit a specifically high peel strength at a low etching amount, resulting in formation of a roughened shape excellent in adhesion with a resin.

As shown in FIG. 2, samples having a solder resist layer formed on a surface roughened with the microetching agents of Compositions 1 and 2 exhibited a higher peel strength even after the HAST test as compared to the case where the microetching agents of Compositions 3 to 5 was used. When the etching amount was 0.1 μm, the adhesion retention (ratio of peel strength before and after the HAST test) was 34% for Composition 1, 36% for Composition 2, 25% for Composition 3, 24% for Composition 4 and 22% for Composition 5. When the etching amount was 0.2 μm, the adhesion retention (ratio of peel strength before and after the HAST test) was 38% for Composition 1, 46% for Composition 2, 35% for Composition 3, 21% for Composition 4 and 13% for Composition 5.

These results show that samples in which a solder resist layer is formed on a copper layer roughened with a low etching amount using microetching agent of Compositions 1 and 2 have high initial adhesion and excellent moisture absorption durability.

The invention claimed is:

1. A microetching agent for roughening a copper surface, wherein:
   the microetching agent is an acidic aqueous solution having a pH of more than 1 and 5 or less,
   the microetching agent comprises an organic acid, cupric ions and chloride ions,
   the microetching agent is free from a cupric complex of azoles,
   the microetching agent is substantially free from a cationic polymer having a weight average molecular weight of 1000 or more, wherein a weight concentration of the cationic polymer is 0.5 ppm or less,
   a molar concentration of the chloride ions is 0.005 to 0.1 mol/L, and
   a molar concentration of the cupric ions is 2.2 to 30 times the molar concentration of the chloride ions.

2. The microetching agent according to claim 1, wherein a molar concentration of the cupric ions is 0.05 to 2 mol/L.

* * * * *